United States Patent [19]
Futami et al.

[11] Patent Number: 5,559,740
[45] Date of Patent: Sep. 24, 1996

[54] IMAGE MEMORY APPARATUS

[75] Inventors: Hiroyuki Futami; Hiroyuki Yamamoto, both of Hachioji, Japan

[73] Assignee: Konica Corporation, Tokyo, Japan

[21] Appl. No.: 432,689

[22] Filed: May 2, 1995

[30] Foreign Application Priority Data

May 19, 1994 [JP] Japan ..................... 6105134

[51] Int. Cl.$^6$ ................................ G11C 11/40
[52] U.S. Cl. ............... 365/189.04; 365/230.05; 365/238.5
[58] Field of Search ............ 365/238.5, 230.05, 365/230.09, 189.04, 230.03

[56] References Cited

U.S. PATENT DOCUMENTS

| | | | |
|---|---|---|---|
| 4,521,813 | 6/1985 | Yoshida | 358/296 |
| 5,177,706 | 1/1993 | Shinohara | 65/189.04 |
| 5,398,209 | 3/1995 | Iwakiri | 365/230.03 |
| 5,495,444 | 2/1996 | Okubo | 365/189.04 |

Primary Examiner—David C. Nelms
Assistant Examiner—Son Mai
Attorney, Agent, or Firm—Frishauf, Holtz, Goodman, Langer & Chick

[57] ABSTRACT

An image memory apparatus for storing image data which includes: plural memory cells, arranged in a one-chip memory, for inputting image data and for outputting the image data therefrom; a writing line, connected with all of the plural memory cells, for inputting the image data into the plural memory cells; a readout line, provided independent from the writing line and connected to all of the plural memory cells, for outputting the image data from the plural memory cells; a first address designating line, connected with the plural memory cells, for identifying one of the plural memory cells which is subjected to an input of the image data through the writing line; a second address designating line, provided independent from the first address designating line and connected with the plural memory cells, for identifying one of the plural memory cells which is subjected to an output of the image data through the readout line.

10 Claims, 10 Drawing Sheets

LINE MEMORY CELL 5,559,740

IMAGE MEMORY APPARATUS

BACKGROUND OF THE INVENTION

The present invention relates to an image memory apparatus in which an address is assigned and image information is inputted into and outputted from the apparatus, and specifically, to a technology for promoting concurrent processing of writing and reading operations so that high speed processing can be carried out.

Recently, the capacity of memory devices has been greatly increased, and one-chip memory devices having small dimensions and large memory capacity have been developed. When such a memory device is installed into a computer operated apparatus, dimensions of the apparatus can be reduced.

For example, FIG. 8 shows a block diagram of a digital copier in which the above-described memory device is installed. When a copying operation for a plurality of sheets is carried out, the following operations are carried out as described below.

Initially, when a CCD 30 photoelectrically converts an optical image on an original document, and outputs an analog image signal, an analog signal processing circuit 31 amplifies the analog image signal, carries out signal processing such as offset adjustment, and the like, and then, outputs the signal-processed image signal to an A/D conversion circuit 32. Then, the analog image signal is digitalized by the A/D conversion circuit 32, and when a multi-valued image signal is obtained, the image signal processing circuit 33 carries out signal processing such as shading correction. The multivalued image signal is stored in an image memory 34, and also is recorded by a laser beam printer 36 through a laser writing circuit 35.

In the case where multi-copying is carried out, the image is continuously recorded when the multivalued image signal stored in the image memory 34 is read out.

Alternatively, sometimes, a personal computer 37 is used instead of the image memory 34, as shown in FIG. 9, and the image manufactured by the personal computer is recorded in the same way as shown in FIG. 8.

In this connection, when the memory capacity of a one-chip memory is increased, although the dimensions of computer operated apparatus can be made smaller, new problems occur in some instances.

That is, because the address area allocated to the one-chip memory is increased, data of the different address in the address area allocated to the chip can not be written or read concurrently, when data of the objective addresses is written or read.

That is, regarding the above-described example of the digital copier, in the copy of a plurality of volumes of original documents, consisting of a plurality of sheets, in the case where, for example, the one-chip memory has a memory capacity sufficient for a plurality of sheets, if the recording operation is carried out, having priority to the reading operation, the second sheet reading operation can not be carried out until recording of a plurality of volumes of the first sheet have been completed. Reversely, when the reading operation is carried out prior to the recording operation, the recording operation can not be carried out until the reading operation of a plurality of sheets has been completed. Accordingly, although the copier has independent reading functions and recording functions, both functions can not be used efficiently, which is a problem.

The reason for the preceding statements is that the entire memory area is fixed to the writing mode or the reading mode in the structure of the memory as shown in a block diagram of the memory in FIG. 10 when the writing operation or the reading operation is carried out to the memory. In the above example, when a plurality of volumes of the first sheet are being read, the memory is in the reading mode. Therefore, a second sheet can not be written in the memory. Further, when a plurality of sheets of the original document have been read, and these are being written into the memory, the memory is fixed to the writing mode. Therefore, the first sheet can not be read out and recorded. The reason for the above is that the other mode can not be set concurrently with respect to another address area.

SUMMARY OF THE INVENTION

The present invention is accomplished in view of the forgoing problems. The objective of the present invention is to solve the foregoing problems, and to provide an image memory apparatus for concurrently carrying out input and output operations of data so that the memory can be more efficiently used, while reducing dimensions of the memory device.

In view of the foregoing, the image memory apparatus of the present invention comprises: a plurality of memory cells arranged in a one-chip memory; a readout line and a writing line independently provided for inputting image information into each of the memory cells and outputting the image information from each of the memory cells; an address designating line for reading out the image information and an address designating line for writing the image information, which are respectively provided independently; and a processing means for selecting a predetermined memory cell from the memory cells through the independently provided address designating lines at the time of a write request and a read request.

Here, each memory cell may have the memory capacity into which the image information up to 1 page of an original document can be written.

Further, a selection period of the selected memory cell may be set in such a manner that writing the image information into the memory cell and reading the image information from the memory cell can be sequentially carried out within the selection period. The processing means may be structured so that the write request and the read request are processed in order of their generation when the write request and the read request are generated with a time difference within the selection period of the same memory cell.

Still further, the processing means may be structured so that the reading operation is carried out prior to the writing operation when the write request and the read request of the image information are concurrently generated with respect to the same memory cell.

In addition, the processing means may be structured so that writing of the image information is carried out while a designating signal of the address designating line for writing is generated, and a write clock signal, which is periodically generated, is inputted into the apparatus.

Also, the processing means may be structured so that the image information is read out while the designating signal of the address designating line for reading out is generated, and while the designating signal of the address designating line for writing is not generated.

Due to the above described image memory apparatus, a readout line and a writing line for inputting and outputting the image information are provided, and address designating lines for readout and writing are also provided. Accordingly, a predetermined memory cell for reading and writing the image information is selected through each address designating line, and reading out and writing the image information can be independently carried out. Therefore, the image information can be read out and written concurrently in the one-chip memory.

Further, in the memory apparatus, in which each memory cell has a memory capacity into which the image information up to 1 page of the original document can be written, the image information of a plurality of pages of the original document can be accessed from a different memory cell in the same chip. Accordingly, while the image information of one page is being read, the image information of the next page can be written, so that processing of a plurality of pages can be carried out and greatly improved in the speed of the overall process.

In the memory apparatus, in which the selection period of the memory cell is set so that the writing operation into the memory cell and the reading operation from the memory cell can be sequentially carried out, even when writing and reading of the image information is carried out in such a manner that writing and reading operations are sequentially executed as if the selected period for writing is overlapped with that for reading, the writing operation and the reading operation do not interfere with each other, and the image information can be written and read while the memory cell is selected.

Further, in the image memory apparatus, in which the reading operation is conducted prior to the writing operation, when writing and and reading requests for the image information are generated concurrently to a predetermined memory cell, because the image information stored in the memory cell is read out before writing, elimination of the stored image information caused by writing can be prevented.

Further, in the image memory apparatus, in which the processing means writes the image information into the memory cell while a designating signal of the address designating line for writing is generated, and a periodically generated write clock signal is inputted into the apparatus, writing of the image information can be controlled by a simpler structure because an exclusive use writing signal for executing the writing operation can be neglected.

Further, in the image memory apparatus, in which the processing means reads out the image information from the memory cell while a designating signal of the address designating line for reading is generated, and a designating signal of the address designating line for writing is not generated, readout of the image information can be controlled by a simpler structure because an exclusive use readout signal for executing the readout operation can be neglected.

DETAILED DESCRIPTION OF THE INVENTION

An example of the present invention will be described below.

Figure 1:
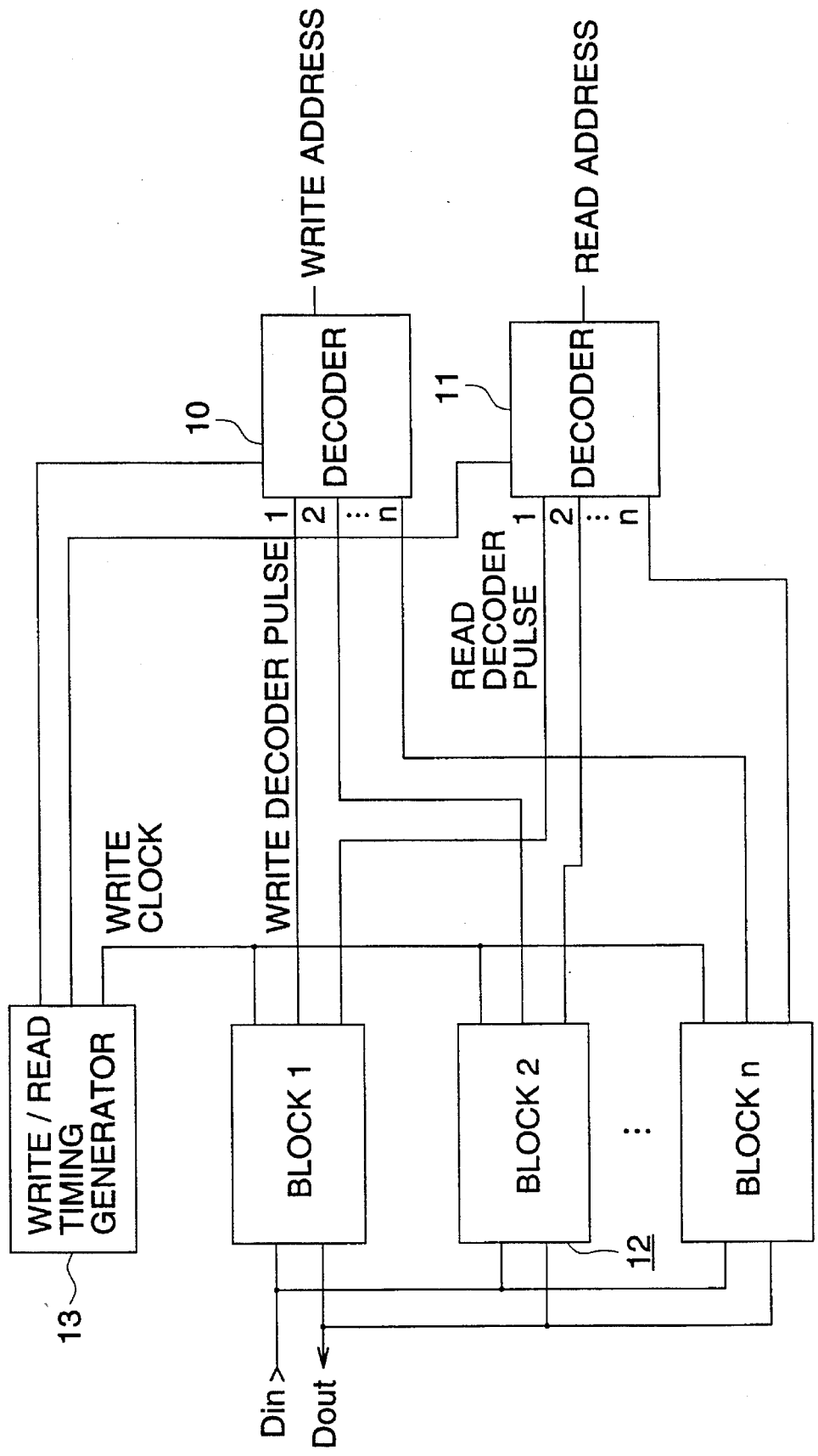
FIG. 1 is a circuit diagram of an image memory apparatus of an example of the present invention.
Figure 2:
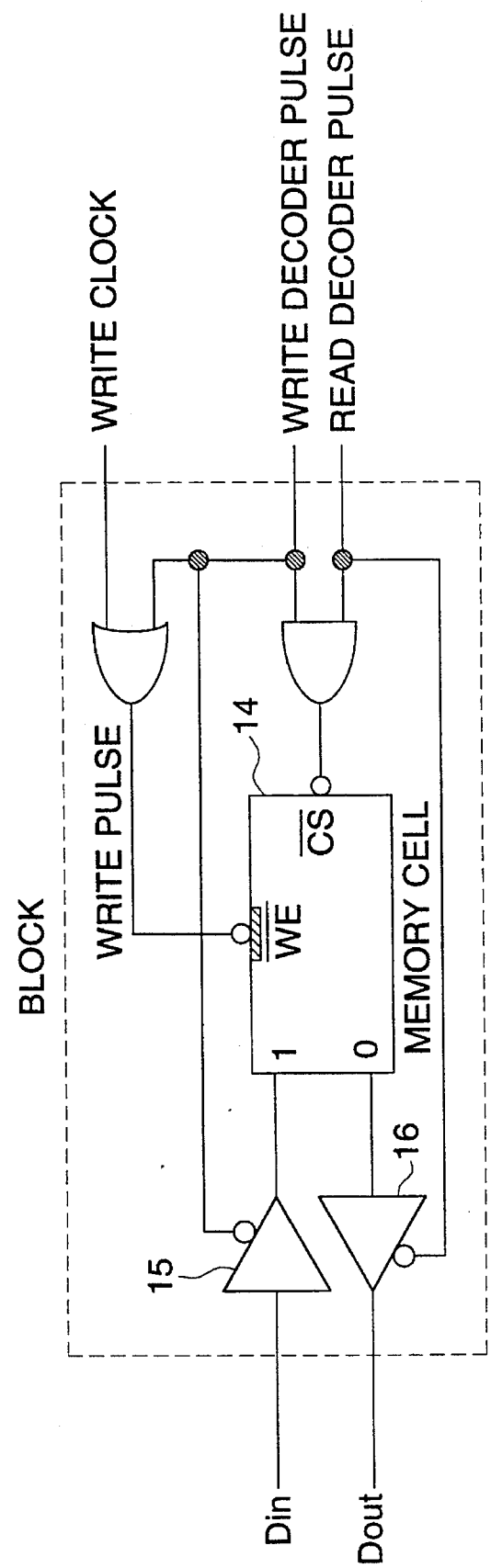
FIG. 2 is a detailed circuit diagram of a block of an example of the present invention.

FIG. 1 is a circuit diagram of an image memory apparatus of an example of the present invention. FIG. 2 is a detailed circuit diagram of a block in FIG. 1.

In FIG. 1, a write address is inputted into a write decoder 10 and a read address is inputted into a read decoder 11 from the outside of the apparatus. Write decoder pulses 1 to n and read decoder pulses 1 to n are respectively generated by the write decoder 10 and read decoder 1t so that one memory block is selected from a plurality of (1 to n) memory blocks 12.

The memory blocks 12 are composed of n blocks, the number of which is equal to the number of data, and each memory block has a memory cell therein. A data input line (hereinafter called Din) and a data output line (hereinafter called Dout), which are common to memory blocks 1 to n, are respectively connected to memory blocks 1 to n. Data is written or read out through each line.

A write/read timing generator 13 supplies write clocks to each memory block 12 so that the memory cell is set to writable status or readable status.

In FIG. 2, the write clock supplied to memory blocks 1 to n is inputted into a write enable terminal (hereinafter called WE terminal) after the write clock has been logically added to the write decoder pulse (hereinafter called write pulse). Concurrently, the write decoder pulse is inputted into a three-state buffer 15, and controls enabling and inhibiting of the write data input to a memory cell 14.

When an L-status signal is inputted into the WE terminal, (L means O-status, and H means 1-status in digital value), the data-writable status is set, and when an H-status signal is inputted into the WE terminal, the readable status is selected.

The logical product of the read decoder pulse and the write decoder pulse is calculated, and the result of the product is inputted into a chip select terminal (hereinafter called CS terminal). The read decoder pulse is inputted into the three-state buffer 16, and controls enabling and inhibiting of the read out data output from the memory cell 14.

In this connection, the CS terminal sets the memory cell 14 to the operation enabling status when the L-status signal is inputted into the CS terminal. The CS terminal sets the memory cell 14 to the operation inhibiting status when the H-status signal is inputted into the CS terminal.

Accordingly, when data is written into the memory cell 14, the following operations are carried out.

Initially, when the write decoder pulse becomes L-status, the data input from the Din into the memory cell 14 is permitted, and the memory cell 14 is made to the operation enabling status. Then, since the memory cell 14 is set to the writable status in timed relationship with the trailing edge of the write clock pulse, data is written into the memory cell 14 during the L-status of the write clock.

On the other hand, when data is read out from the memory cell 14, the following operations are carried out.

Initially, when the write decoder pulse is in the H-status, the write pulse is in the H-status, and the memory cell is set to the readable status. Then, when the read decoder pulse is in the L-status, the data output from the Dout to the memory cell 14 is permitted, and the memory cell 14 is set to the operation enable status in the same manner as in the above case. However, the readable status is not selected in timed relationship with the changing point of the write clock pulse, which is different from the above case.

That is, when the memory cell is in the readable status, the write decoder pulse is in the H-status, that is, as long as the write request signal is not inputted, the write pulse is in the H-status from the beginning of this operation. Accordingly, the memory cell 14 is already set to the readable status. Therefore, data is read out from the memory cell 14 during the L-status in timed relationship with the trailing edge of the read decoder pulse.

Next, a specific example will be explained in detail in a case where the data writing and reading operations are actually carried out asynchronously with each other.

Figure 3:
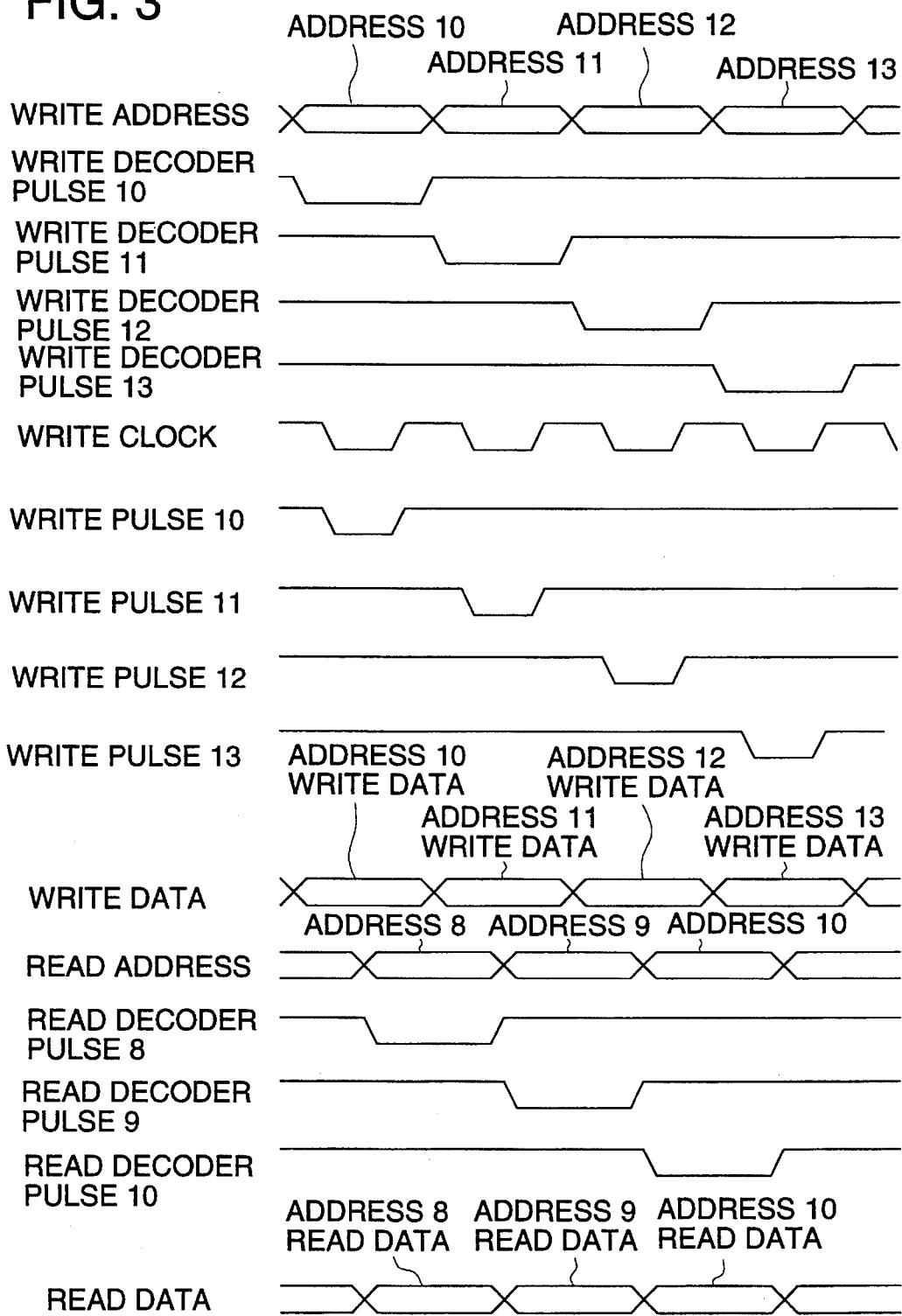
FIG. 3 is a timing chart of signals outputted from each unit of the image memory apparatus according to the present invention.

In FIG. 3 showing timing charts of signals outputted from each position in the image memory apparatus, in the case where a write address signal showing a 10th address (hereinafter called 10th address) and write data (hereinafter called 10th address write data) are inputted from the outside of the apparatus, a write decoder 10 sets only the write decoder pulse 10 outputted from the memory cell 14 corresponding to the 10th address to the L-status in timed relationship with the 10th write address signal when the 10th write address signal is inputted into the apparatus. At this time, the L-status signal is inputted into the CS terminal, and the memory cell 14 is made to the operation allowance status. Then, the data input from the Din is allowed. However, since the write clock is still in the H-status at this time, the memory cell 14 is not yet set to the writable status, and the 10th address write data is not written.

After a while, when the write clock is set to the L-status, the logical add output (write pulse) of the write clock and the write decoder pulse 10 is also in L-status, and is inputted into the WE terminal. The memory cell 14 is set to the writable status, in timed relationship with the trailing edge of the write pulse, and while the write pulse is in the L-status. Then, the 10th address write data is written into the memory cell 14 for the first time.

When a read address expressing an 8th address (hereinafter, called 8th read address) is inputted from the outside of the apparatus, the read decoder 11 sets only the read decoder pulse 8 corresponding to the 8th address in the memory cell 14 to L-status in timed relationship with the inputted 8th read address. At this time, an L-status signal is inputted into the CS terminal corresponding to the read decoder pulse 8, and the memory cell 14 is made to the operation allowance status, and the data output from the Dout is also allowed. Since the write pulse in the H-status has already been inputted into the WE terminal as described above, the memory cell 14 has already been selected to be in the readable status. Then, the data output from the Dout is allowed in timed relationship with the trailing edge of the read decoder pulse 8, and 8th address read data is read out.

As described above, the independent write address and read address select each block, and the write pulse sets the memory cell 14 to be in the data writable status or data readable status corresponding to this selection. Accordingly, writing and reading of image information can be parallely carried out in one-chip asynchronously with each other.

Next, another example will be described below.

Referring to FIG. 4 to FIG. 7, the example will be described in detail concerning a case where this technology is applied to a digital copier. In this example, the same symbols and numerals denote the same portions of the same structure, and portions different from those in the former example will be described.

Figure 4:
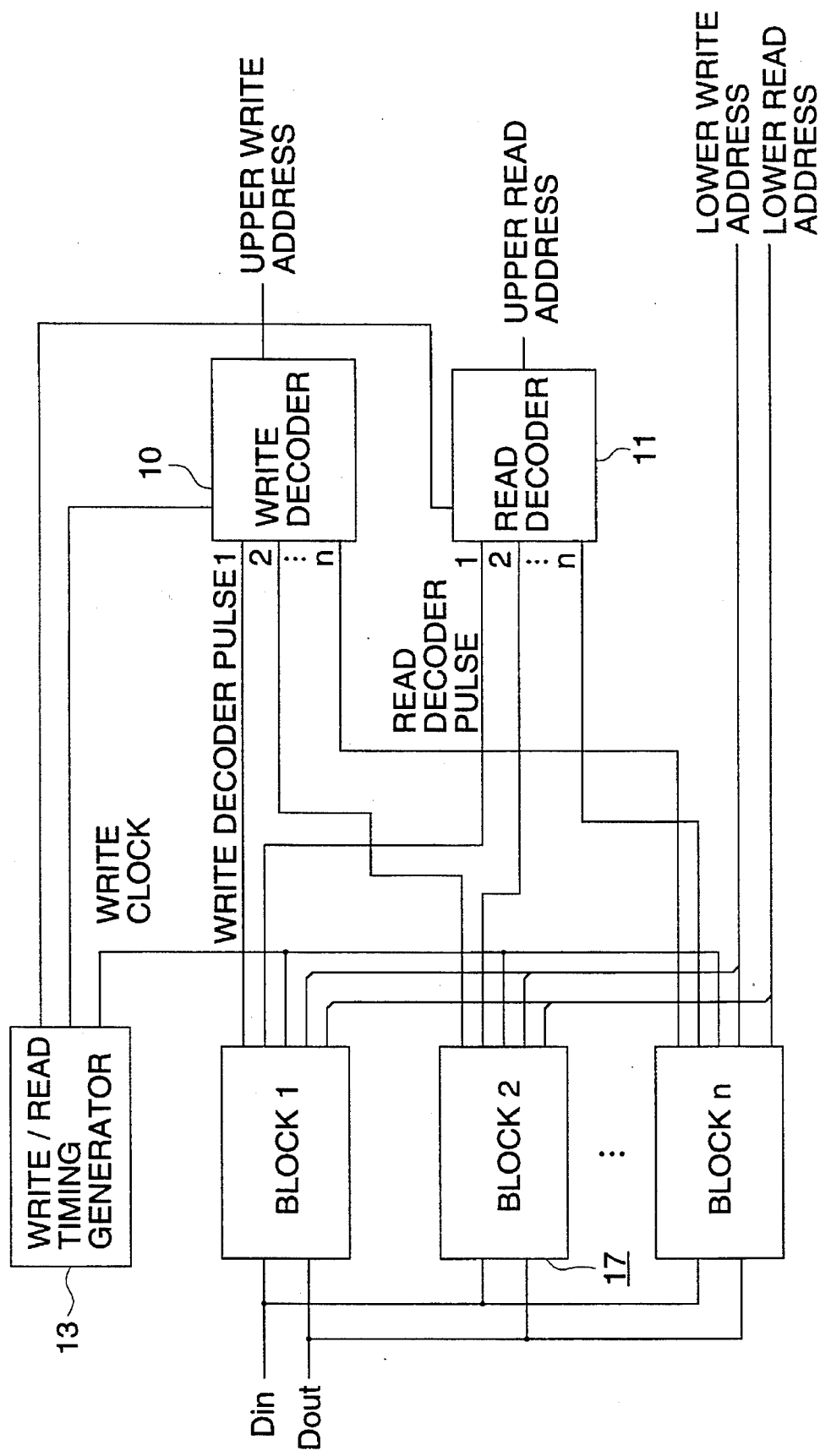
FIG. 4 is a circuit diagram of the image memory apparatus of a digital copier of another example of the present invention.
Figure 5:
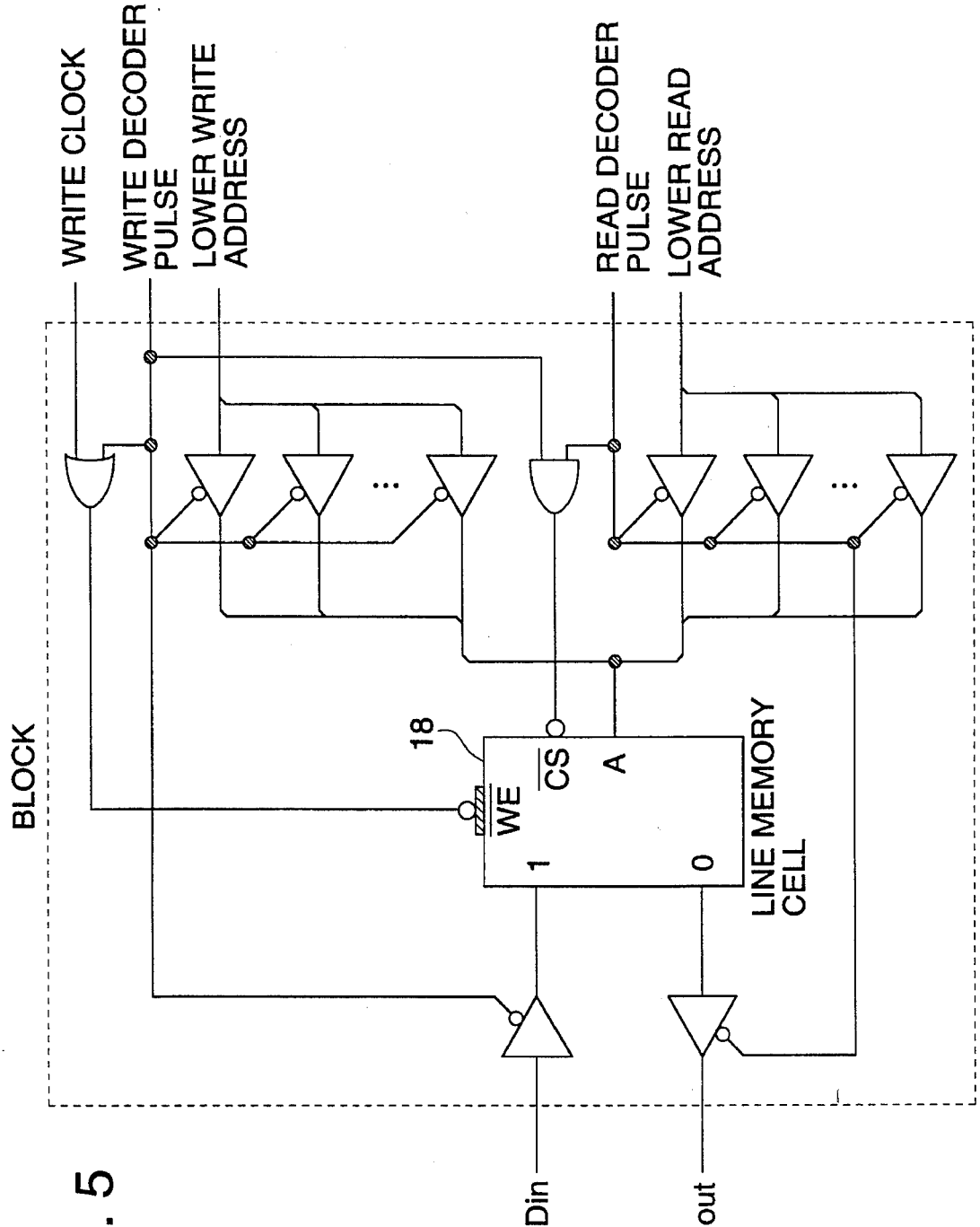
FIG. 5 is a detailed circuit diagram of a block of another example of the present invention.

FIG. 4 is a circuit diagram of the image memory apparatus installed in a digital copier, and FIG. 5 is a detailed circuit diagram of a block in FIG. 4.

Figure 6:
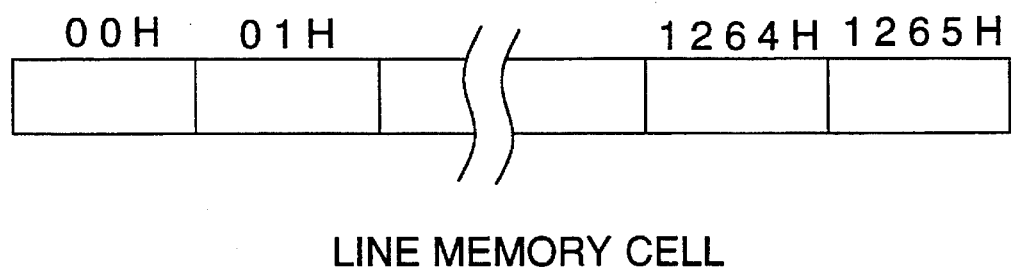
FIG. 6 is a view showing the memory area of another example of the present invention.

In FIGS. 4 and 5, a line memory cell 18 installed in each block in memory blocks 17 can store data of 1 line (for example, 4709 data on an A4-Y-sized sheet), and has an area corresponding to a 0000th address to a 1265th address (in the hexadecimal number) as shown in FIG. 6 showing a memory area. On the other hand, the memory blocks 17 are composed of n blocks (for example, for an A3-sized sheet, 6660 blocks per page, and 333000 blocks per 50 pages) the number of which is equal to the number of subsidiary scanning lines.

The write address and the read address are respectively divided into an upper address and a lower address. The upper address corresponds to the write address or the read address in the former example, and the lower address specifies each bit of data of 1 line. A terminal for this address input is provided in the line memory cell 18. A lower write address line and a lower read address line are connected to the memory cell 18 provided in each block.

A case where writing and reading operations of the line data are actually carried out asynchronously with each other, will be described in detail below, referring to a specific example. Here, for convenience of explanation, line data is written in the 10th line memory cell 18, and data is read out from the 8th line memory cell 18.

Figure 7:
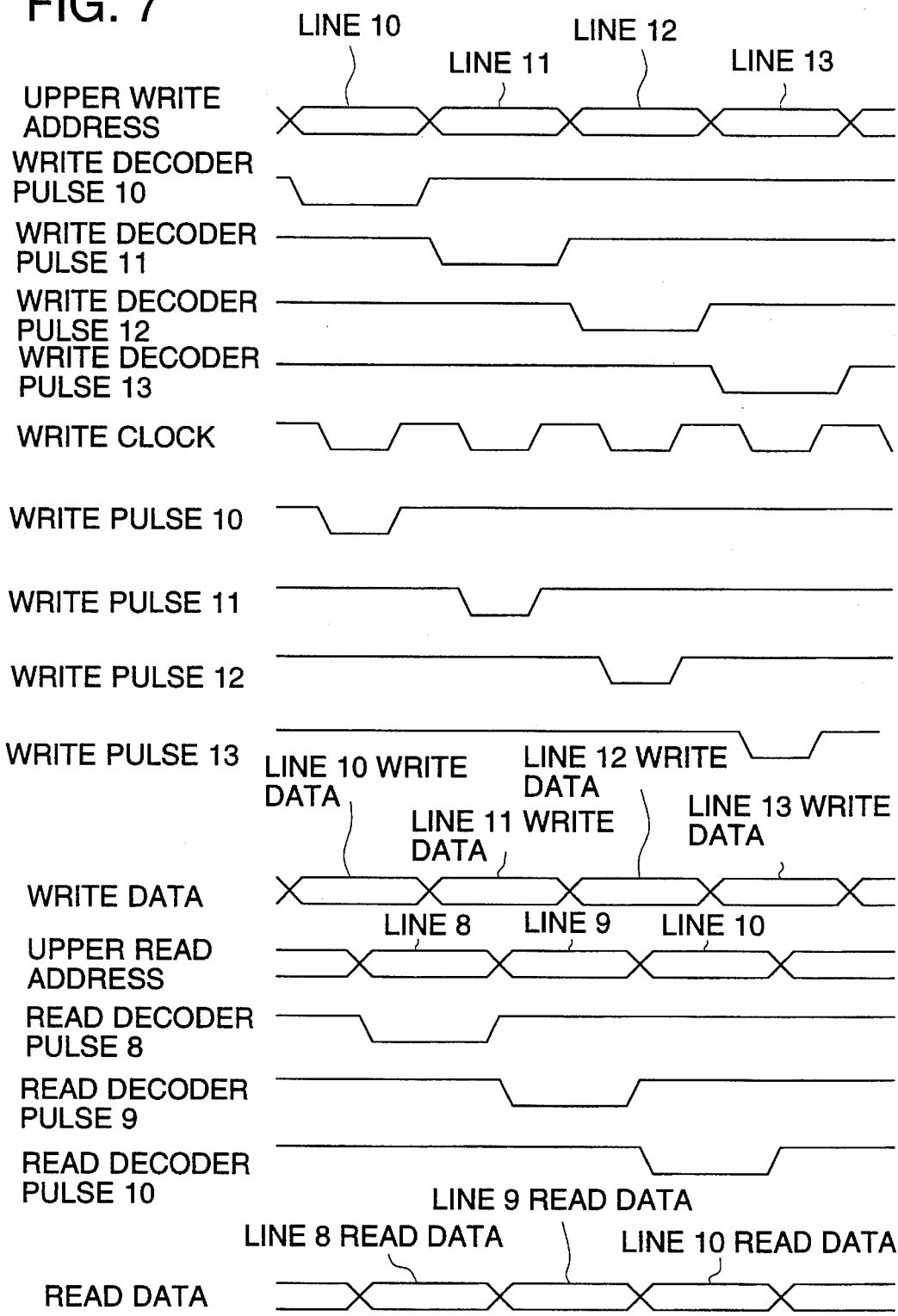
FIG. 7 is a timing chart of signals outputted from each unit of the image memory apparatus of another example of the present invention.
Figure 8:
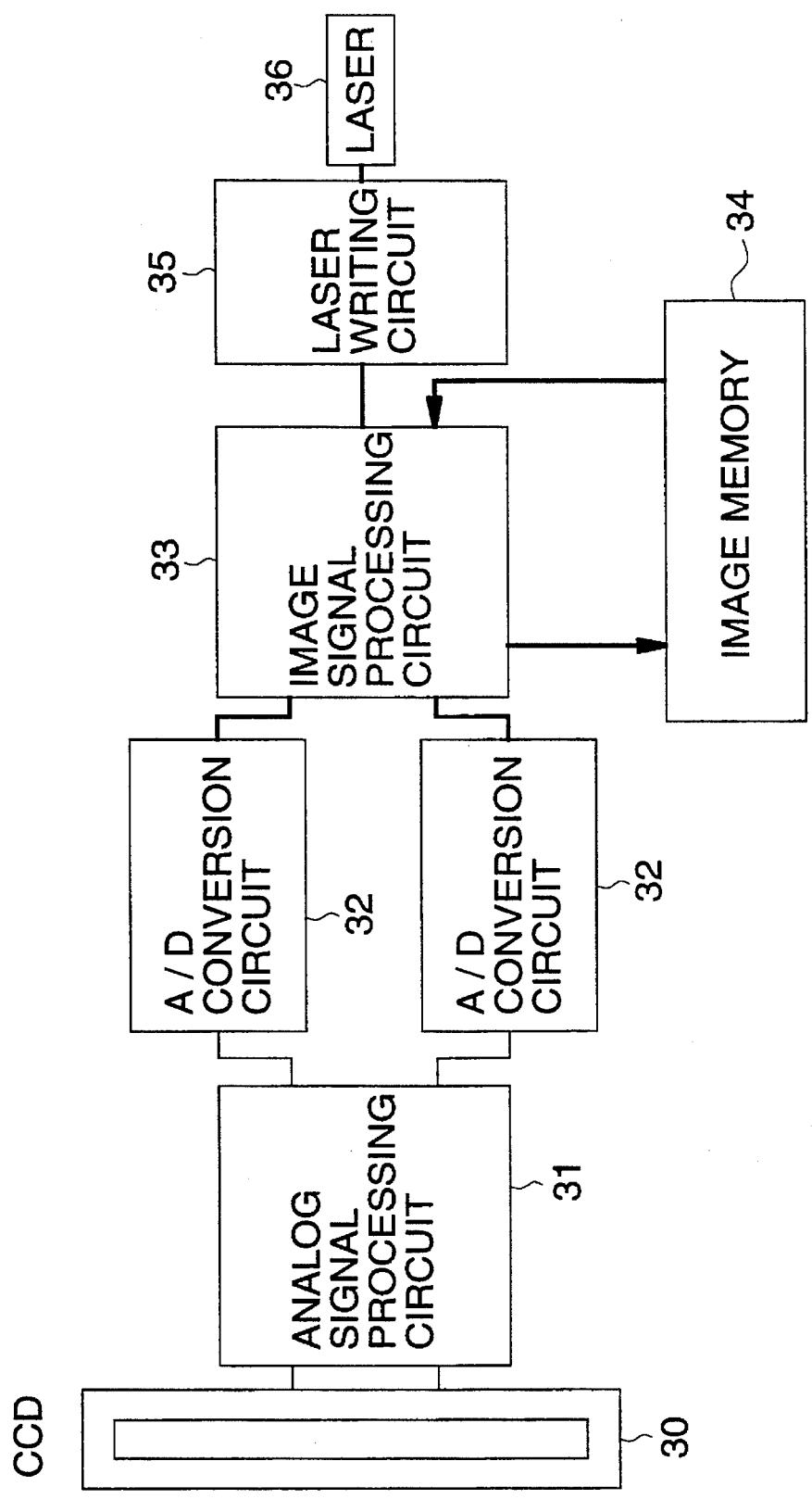
FIG. 8 is a block diagram of the conventional digital copier in which a memory is installed.
Figure 9:
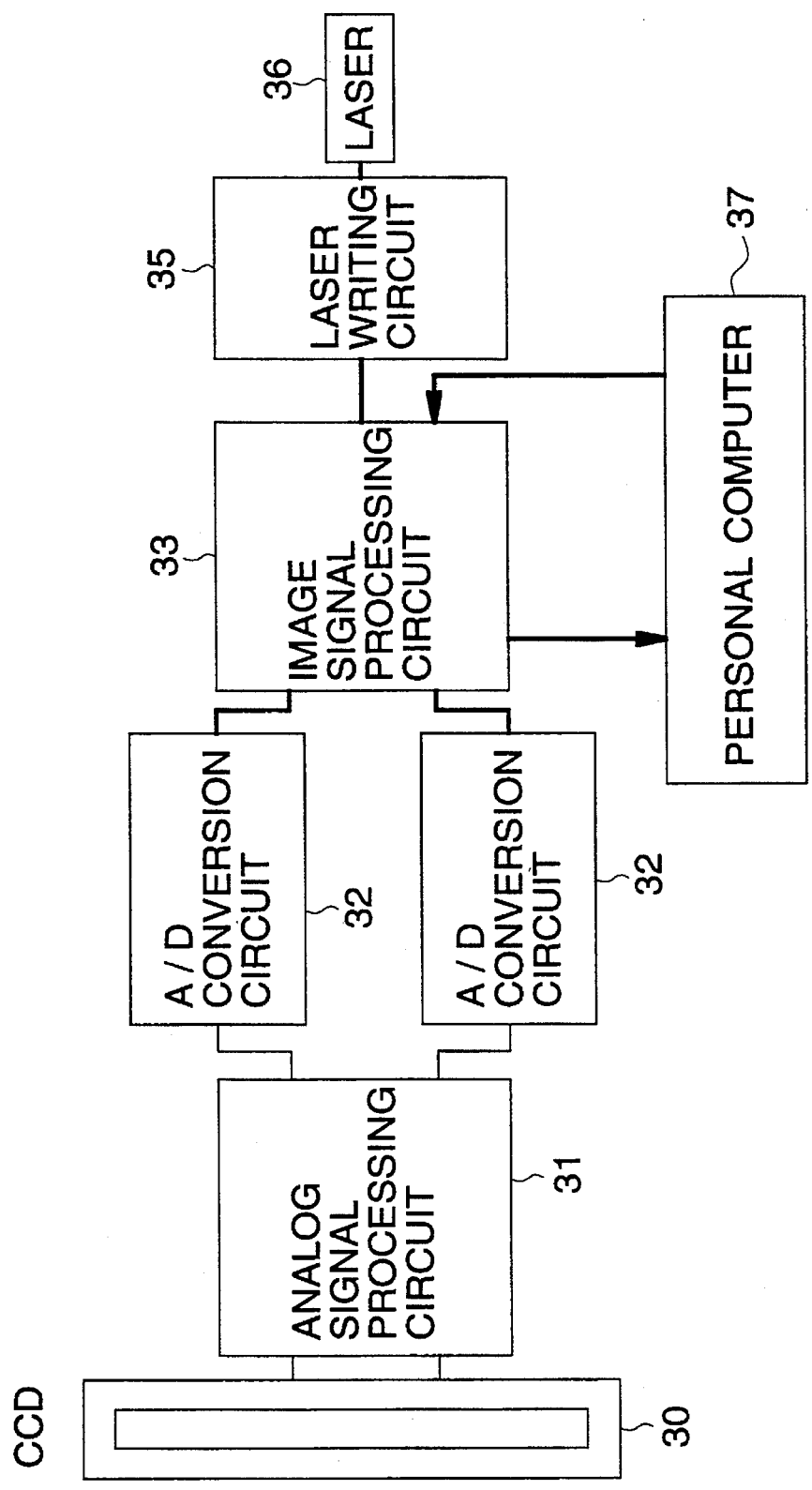
FIG. 9 is a block diagram of the conventional digital copier in which a personal computer is installed.
Figure 10:
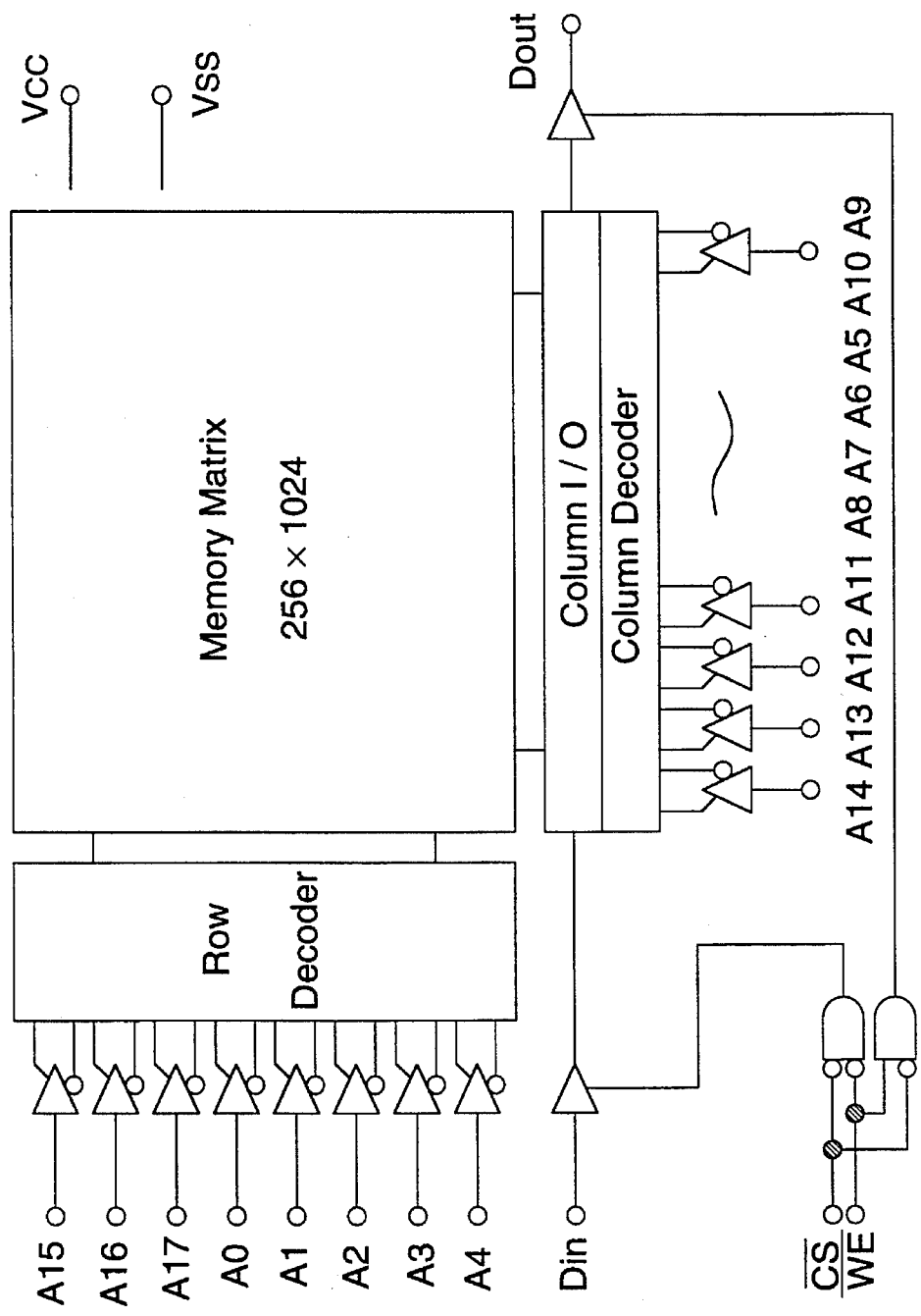
FIG. 10 is a block diagram of a memory of the conventional example.

In FIG. 7, showing a timing chart of signals of each portion in the image memory apparatus, when the upper write address showing the 10th line address (hereinafter, called 10th line write address) and line write data (hereinafter, called 10th line write data) are inputted from the outside of the apparatus, the write decoder 10 sets only the write decoder pulse 10 of the line memory cell 18 corresponding to the 10th line, to the L-status in timed relationship with the 10th line write address when the 10th line write address is inputted into the apparatus. This write decoder pulse 10 makes the 10th line memory cell 18 to the operation allowance status through the CS terminal, and allows the data input from the Din and the lower write address input.

When the write clock is set to the L-status, the logical add (OR) output (write pulse) of the write clock and the write decoder pulse 10 also becomes L-status and is inputted into the WE terminal. The line memory cell 18 is set to the writable status during the period of L-status in timed relationship with the trailing edge of the write pulse. Therefore, at this time, the 10th line write data of 1 line is written into the line memory cell by bit designated by the write address. As described above, the write clock is inputted into the WE terminal of the line memory cell 18, and the line memory cell 18 can be set to the writable status only by setting the write address data. Accordingly, an exclusive use write signal for executing the writing operation as in the conventional technology is not necessary, and writing of the image information can be controlled by a simple structure.

When the upper read address expressing the 8th line address (hereinafter, called 8th line read address) is inputted from the outside of the apparatus, the data output from the Dour is allowed in timed relationship with the trailing edge of the read decoder pulse 8 as described above, and the 8th line read data is read out during the period of the L-status of the read decoder pulse 8. Accordingly, an exclusive use readout signal for executing the readout operation as in the conventional technology is not necessary, and readout of the image information can be controlled by a simple structure.

When the line data is read out from the line memory cell 18, the readout operation is carried out in timed relationship with the changing point (trailing edge) of the read decoder pulse, not with the changing point of the write clock. This point is different from that in the case of the writing operation. This difference will be described later, and is related to the processing at the time when data writing and data reading are concurrently required.

Here, the relationship of the write decoder pulse and the write clock will be described below.

The write clock is an alternating signal in which the L-status and the H-status are alternately found. One time period of the write clock is set to the same as that of the write decoder pulse, and the positional relationship of two pulses is set in such a manner that the L-status of the write clock is positioned at the center of the write decoder pulse. Further, the period of the L-status of the write clock is set to the period of about 2 times the time sufficient for writing the data into the line memory cell 18. That is, practically, the writing operation is completed within half the period of the L-status of the write clock.

On the other hand, the read decoder pulse also has the same period and the same positional relationship.

Accordingly, when the write decoder pulse is compared with the write clock, the first ¼ period from the starting point of the write decoder pulse corresponds to the H-status of the write clock, the next ½ period corresponds to the L-status of the write clock, and the remaining ¼ period corresponds to the H-status of the write clock. The composition mentioned above has a significant meaning specifically when writing and reading of the image information are carried out in such a manner that the designating period of the line memory 18 for writing and that for reading are overlapped, or when writing and reading of the image information are concurrently carried out.

For example, a case where reading from the same line address as the writing address is commanded at the time of writing, will be explained below.

In the case where both the write decoder pulse and the write clock pulse are in the L-status, when the read decoder pulse also becomes the L-status, initially the line data writing is completed according to the L-status of the write clock pulse. Then, the Dout and the lower read address signal are allowed according to the read decoder pulse. However, since the line memory cell is in the writable status during the period of the L-status of the write clock pulse, the line data is not read out. When the status of the write clock pulse is changed to the H-status during the period of the L-status of the write decoder pulse, the status of the line memory cell 18 is switched to the readable status in timed relationship with the leading edge of the write clock pulse. Further, since this readable status continues for half the period of H-status of the write clock pulse, the line data which was just written can be read out. Reversely, also in a case where writing is carried out at the time of reading, the line data can be written in the same way.

Next, a case where writing and reading are concurrently carried out, will be described.

In this case, the image memory apparatus is in an abnormal status, and it is necessary that the control apparatus side, which essentially controls this apparatus, avoids such a case. However, in the case where an asynchronous and high speed access operation of an enormous amount of data is carried out, it is preferable that the image memory apparatus side also has a fail-safe function. Accordingly, the image memory apparatus of this example prevents the loss of data, and is controlled so that the apparatus is not stopped and processing can be normally continued.

When the write decoder pulse and the read decoder pulse are concurrently in the L-status, both the data input from the Din and the data output from the Dout are permitted, and writing and reading out of the write address data and the read address data are also permitted. However, initially, the line memory cell 18 is in the readable status determined by the output of the logical add operation of the write decoder pulse and the write clock pulse. Further, this reading status continues during the half period of the H-status of the write clock pulse, and this status is selected in timed relationship with the trailing edge of the read decoder pulse. Accordingly, the read out of line data can be carried out prior to the writing.

Here, when the readout is selected in timed relationship with the changing point (leading edge) of the write clock pulse in the same way as the writing, the readout can not be carried out prior to writing.

After that, when the write clock pulse is changed to L-status, the readable status is changed to the writable status, and the writing processing is carried out in the same manner as described above.

In this connection, the readout can be carried out prior to writing also in the case where the readable status is set when the write clock is stopped, and the write clock is restored after the completion of readout of the line data.

In this example, input/output data is used as binary data. However, input/output data may be multivalued data, and the type of data is not limited to this example.

Further, in this example, the line memory cells, each having the capacity of one line, are arranged for a plurality of pages, and writing and readout are concurrently carried out. However, the following change of design may be accepted. The capacity of the line memory cell is changed to the capacity for one page, and the entire capacity of the one-chip memory is changed to the capacity for at least 2 pages. In this case, writing and readout can be concurrently carried out in the same manner as in this example.

According to the present invention, as described above, the readout line and the writing line for inputting and outputting the image information are provided, and address designating lines for readout and writing are also provided. Accordingly, memory cells necessary for readout and writing are selected through address designating lines, and independent readout and writing of the image information are carried out. Therefore, readout and writing of the image information can be concurrently carried out in the one-chip memory.

In the apparatus in which each memory cell has the memory capacity, in which the image information of less than one page of original document can be written, the access of the image information of a plurality of pages can be carried out from memory cells which are different from each other in the same chip memory. Accordingly, image data on the next page can be written in the memory cell while the image data on the current page is being read. Therefore, processing speed for a plurality of pages can be greatly improved.

In an apparatus in which the operation period of the memory cell is set to the period of time in which writing into the memory cell and readout from the memory cell can be sequentially carried out, even when the writing operation and the readout operation of the image information is carried out in such a manner that the designating period of time of the same memory cell for these operations are overlapped on each other, these operations are not limited to each other, so that the writing and readout of the image information can be carried out within the designating period of time of the memory cell.

Further, in an apparatus in which the readout status is set prior to the writing status at the time when writing and readout of the image information are concurrently required in a memory cell, the image information stored in the memory cell is read out prior to the writing operation. Accordingly, the following can be prevented: when the writing operation occurs prior to the reading operation, the image information stored in the memory cell is erased.

Still further, in an apparatus in which the image information is written by the processing means while the designating signal of the address designating line for writing is being generated, and while the periodically generated write clock signal is being inputted, the exclusive use writing signal for executing the writing operation can be omitted, so that the writing of the image information can be controlled by a simplified structure.

Further, in an apparatus in which the image information is read out by the processing means while the designating signal of the address designating line for reading is being generated, and while the designating signal of the address designating line for writing is not generated, the exclusive use readout signal for executing the readout operation can be omitted, so that the readout of the image information can be controlled by a simplified structure.

What is claimed is:

1. An image memory apparatus for storing image data, comprising:
    a plurality of memory cells, arranged in a one-chip memory, for inputting image data and for outputting said image data therefrom;
    a plurality of writing lines, each connected with said plurality of memory cells, for inputting said image data into said plurality of memory cells;
    a plurality of readout lines, provided independent from said plurality of writing lines and each connected to said plurality of memory cells, for outputting said image data from said plurality of memory cells;
    a first address designating line, connected with said plurality of memory cells, for identifying one of said plurality of memory cells which is subjected to an input of said image data through said writing line;
    a clock signal generator for generating periodic clock signals with which said inputting of said image data is enabled;
    a second address designating line, provided independent from said first address designating line and connected with said plurality of memory cells, for identifying one of said plurality of memory cells which is subjected to an output of said image data through said readout line; and
    control means for identifying one of said plurality of memory cells with said first address designating line and said second address designating line so that said input and said output of said image data to and from the identified one of said plurality of memory cells are both carried out in a minimum of one cycle of said periodic clock signal.

2. The apparatus of claim 1, wherein each of said plurality of memory cells has a memory capacity to which said image data, corresponding to a volume a one page document, is inputted.

3. An image memory apparatus for storing image data, comprising:
    a plurality of memory cells, arranged in a one-chip memory, for inputting image data and for outputting said image data therefrom;
    a plurality of writing lines, each connected with said plurality of memory cells, for inputting said image data into said plurality of memory cells;
    a plurality of readout lines, provided independent from said plurality of writing lines and each connected to said plurality of memory cells, for outputting said image data from said plurality of memory cells;
    a first address designating line, connected with said plurality of memory cells, for identifying one of said plurality of memory cells which is subjected to an input of said image data through said writing lines;
    a second address designating line, provided independent from said first address designating line and connected with said plurality of memory cells, for identifying one of said plurality of memory cells which is subjected to an output of said image data through said readout line; and
    control means for:
        identifying one of said plurality of memory cells with said first address designating line and said second address designating line so that said image data are inputted and outputted respectively,
        identifying one of said plurality of memory cells,
        inputting said image data to an identified one of said plurality of memory cells, and
        outputting said image data from said identified one of said plurality of memory cells,
        all within a predetermined designating time period which is longer than a total of an inputting period of said image data from the identified one of said plurality of memory cells and an outputting period of said image data to the identified one of said plurality of memory cells.

4. The apparatus of claim 1, wherein said image data is outputted from one of said plurality of memory cells through said readout line before said image data is inputted into the same one of said plurality of memory cells through said writing line when said control means designates the same one of said plurality of memory cells simultaneously by said first address designating line and said second address designating line.

5. The apparatus of claim 1, further comprising:
    controlling means for generating first designating signals which are sent to said plurality of memory cells through said first address designating line so as to identify one of said plurality of memory cells;

wherein said image data is inputted into one of said plurality of memory cells in synchronism with both of said periodic clock signals and said first designating signals.

6. The apparatus of claim 3, further comprising:

a clock signal generator for generating periodic clock signals; and controlling means for generating first designating signals which are sent to said plurality of memory cells through said first address designating line so as to identify one of said plurality of memory cells;

wherein said image data is inputted into one of said plurality of memory cells in synchronism with both of said periodic clock signals and said first designating signals.

7. The apparatus of claim 6, wherein said predetermined designating period is longer than one cycle of said periodic clock signal.

8. The apparatus of claim 3, wherein said image data is outputted from one of said plurality of memory cells through said readout line before said image data is inputted into the same one of said plurality of memory cells through said writing line when said control means designates the same one of said plurality of memory cells simultaneously by said first address designating line and said second address designating line.

9. The apparatus of claim 3, further comprising a clock signal generator for generating periodic clock signals with which said inputting of said image data is enabled.

10. An image memory apparatus for storing image data, comprising:

a plurality of memory cells, arranged in a one-chip memory, for inputting image data and for outputting said image data therefrom;

a plurality of writing lines, each connected with said plurality of memory cells, for inputting said image data into said plurality of memory cells;

a plurality of readout lines, provided independent from said plurality of writing lines and each connected to said plurality of memory cells, for outputting said image data from said plurality of memory cells;

a first address designating line, connected with said plurality of memory cells, for identifying one of said plurality of memory cells which is subjected to an input of said image data through said writing line;

a second address designating line, provided independent from said first address designating line and connected with said plurality of memory cells, for identifying one of said plurality of memory cells which is subjected to an output of said image data through said readout line; and control means for identifying one of said plurality of memory cells with said first address designating line and said second address designating line so that said input and said output of said image data to and from the identified one of said plurality of memory cells are both carried out in a minimum of one cycle of said periodic clock signal;

wherein said image data is outputted from one of said plurality of memory cells through said readout line before said image data is inputted into the same one of said plurality of memory cells through said writing line when said control means designates the same one of said plurality of memory cells simultaneously by said first address designating line and said second address designating line.

* * * * *